(12) United States Patent
Hong

(10) Patent No.: US 6,756,261 B2
(45) Date of Patent: Jun. 29, 2004

(54) METHOD FOR FABRICATING CAPACITORS IN SEMICONDUCTOR DEVICES

(75) Inventor: Kwon Hong, Kyoungki-Do (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 75 days.

(21) Appl. No.: 10/247,398

(22) Filed: Sep. 19, 2002

(65) Prior Publication Data

US 2003/0060008 A1 Mar. 27, 2003

(30) Foreign Application Priority Data

Sep. 22, 2001 (KR) .......................................... 2001-58831

(51) Int. Cl.[7] .......................................... H01L 21/8242
(52) U.S. Cl. .......................... 438/239; 438/240; 438/381
(58) Field of Search ............................ 438/3, 239, 240, 438/243, 253, 381, 393, 396, 663, 680, 681, 692

(56) References Cited

U.S. PATENT DOCUMENTS 5,849,618 A * 12/1998 Jeon ............................ 438/254
5,861,332 A * 1/1999 Yu et al. ....................... 438/240
6,096,592 A   8/2000 Cho
6,287,910 B2 * 9/2001 Lee et al. ..................... 438/240
6,340,622 B1 * 1/2002 Lee et al. ..................... 438/396
6,503,810 B2 * 1/2003 Lee .............................. 438/396

FOREIGN PATENT DOCUMENTS

KR    1999-39612    6/1999
KR    1999-57678    7/1999

* cited by examiner

Primary Examiner—David Nhu
(74) Attorney, Agent, or Firm—Marshall, Gerstein & Borun LLP

(57) ABSTRACT

A method for fabricating a capacitor of a semiconductor device is disclosed, which can control the composition of a dielectric layer easily and improve the property of leakage current while not dropping the throughput because it does not need to require to lower the process temperature and pressure. The method includes: a) forming a bottom electrode; b) forming an STO seed layer as a first dielectric layer on the bottom electrode; c) forming a BST layer as a second dielectric layer on the STO seed layer; and d) forming a top electrode on the BST layer.

16 Claims, 5 Drawing Sheets

METHOD FOR FABRICATING CAPACITORS IN SEMICONDUCTOR DEVICES

BACKGROUND

1. Technical Field

A method for fabricating a highly integrated semiconductor device is disclosed. More particularly, a method for fabricating a capacitor using a high dielectric substance as the dielectric layer is disclosed.

2. Description of the Related Art

Generally, as a semiconductor devices becomes highly integrated and miniaturized, the area occupied by the constitutional elements of these devices gets smaller. As the size of a semiconductor device shrinks, however, a minimum capacitance needs to be secured to drive the device.

When fabricating a capacitor of a 64 Mbyte or 256 Mbyte-DRAM using a conventional dielectric material such as $SiO_2$ or $Si_3N_4$, the area occupied by the capacitor should be more than six times as big as the cell area to secure the essential capacitance, even though the $SiO_2$ or $Si_3N_4$ layer is made as thin as possible. As a planar capacitor cannot fulfill this condition, a method for increasing the charge storage area should be sought.

Many structures including a stack capacitor, trench capacitor, or a hemispheric polysilicon layer have been suggested to increase the charge storage area or to increase the storage node surface area of a capacitor. However, in case where the structure of a capacitor is made complicated just to increase its charge storage area, there are problems in that the production cost goes up and the efficiency declines due to complex manufacturing process.

Therefore, it is hard to apply a method of increasing the charge storage area of a capacitor by making it three-dimensional and fulfilling capacitance to a DRAM device in a 1 Gb class.

To solve these problems, studies have been done on a $Ta_2O_5$ dielectric layer as a substitute for a conventional $SiO_2/Si_3N_4$ dielectric layer. However, the capacitance of a $Ta_2O_5$ layer is no more than two to three times that of a $SiO_2/Si_3N_4$ dielectric layer. Accordingly, to employ a $Ta_2O_5$ dielectric layer in a highly integrated DRAM, the thickness of the dielectric layer should be reduced. But, a $Ta_2O_5$ dielectric layer presents has a problem because the amount of leakage current increases with its use.

For this reason, a high dielectric thin film is needed to fabricate a capacitor for 1 Gb DRAMs. When using a thin film with a high dielectric constant, it's possible to obtain adequate capacitance only by a planar capacitor, thus simplifying the manufacturing process. A BST layer, i.e., (Ba, Sr)$TiO_3$, has been studied as a high dielectric material. Capacitors, with a BST layer have a capacitance dozens of times as those capacitors with $SiO_2/Si_3N_4$ layers as well as improved structure and thermal stability. Thus the excellent electric and structural properties of the capacitor with a $BaTiO_3$ layer which makes it an appropriate material for a memory device over a 1 Gb class.

Among other materials having high dielectric constants, the BST layer of a perovskite structure is the most appropriately applicable to a high-density and highly-integrated capacitor, which requires a high dielectric constant and small leakage current. This is because the BST layer features a high dielectric constant and superb insulation property with low dielectric dispersion and dielectric loss at a high frequency, and existing in a paraelectric at a room temperature. Furthermore, the BST layer doesn't have the problem of fatigue or degradation.

However, the dielectric constant and leakage current properties of the BST layer largely depend on its fabrication process and the kind of the electrode material, and the leakage current is far bigger than such an amorphous layer as $SiO_2/Si_3N_4$ group or $Ta_2O_5$. So the thickness of a thin film is limited to the range of 200~300 Å to make the leakage current stay within the acceptable range.

Accordingly, under active development is a method for fabricating a BST layer using a chemical vapor deposition (CVD), which can deposit a thin film on a wide area evenly with superb step coverage and improved control of the material composition as compared to a sputtering method.

Generally, a BST layer is deposited by the chemical vapor deposition (CVD) at a predetermined temperature and pressure. In the first step, the molarity of precursor, the flow rate of precursor through a liquid delivery system (LDS), the temperature of a vaporizer, the temperature of a shower head, the temperature of processes and the pressure of processes are optimized. It is commonly known to have the optimum dielectric property in a composition ratio of Ba:Sr:Ti=25:25:50 (atomic percent).

Therefore, the BST deposition by the CVD can obtain its inherent dielectric property and reduced leakage current not only by developing precursors but by optimizing the deposition condition as well so as to make the composition ratio of Ba+Sr:Ti to be close to 1:1. However, the composition ratio of a BST layer varies with temperature and thickness of deposition because the temperature of the surface of a wafer, i.e., bottom electrode, when the BST layer is initially deposited and the temperature of the surface of the wafer when a little bit of the BST layer is deposited are different.

In short, when a BST layer is deposited on the bottom electrode of the capacitor, the composition change of Ba, Sr and Ti according to the deposition temperature shows low content of Ti and high content of Sr and Ba at a low temperature of the initial step. But, at a high temperature over 450° C., the Ti content goes up to 60 atomic percent while the Sr and Ba content decreases to 10~20 atomic percent.

As the deposition is performed at a high temperature, the BST layer formed during the deposition has a high content of Ti. In the high temperature deposition condition, the BST layer with a thickness of less than approximately 200 Å shows high Ti content. That is, as the layer grows thicker the composition ratio of Ti gets lower. This is because the temperature of a wafer on which a portion of BST layer is already deposited is lower than the temperature of the wafer on which the bottom electrode is only formed. In addition, the composition of Ba, Sr and Ti changes according to pressure.

Therefore, the major factor that controls the electric property of the BST capacitor is the amount of Ti inside the BST layer. It is hard to keep the Ti amount inside the deposited whole BST layer at around 50 atomic percent, and when the Ti makes up more than 50 atomic percent, the overall electric properties of the BST capacitor, such as the thickness of valid oxide layer and the density of leakage current, are degraded.

In short, when fabricating a capacitor by depositing BST as a dielectric layer on an electrode of a noble metal, such as Pt or Ru, the Ti composition gets higher than 50 atomic percent at a high temperature during the procedure of depositing BST layer, and when the deposition temperature or process pressure is lowered to take care of the problem caused by the high temperature, the throughput of the manufacturing process is affected adversely. Also, when the Ti composition is more than 50 atomic percent, the leakage current property is degraded, which influences on the operation of a semiconductor badly.

SUMMARY OF THE INVENTION

Therefore, a method for fabricating a semiconductor device is disclosed, which does not need to lower pressure and thus does not curtail the throughput, and improves the leakage current property by controlling the composition of a dielectric layer.

In accordance with an embodiment, a method for fabricating a capacitor of a semiconductor device comprises: a) forming a bottom electrode; b) forming an STO seed layer as a first dielectric layer on the bottom electrode; c) forming a BST layer as a second dielectric layer on the STO seed layer; and d) forming a top electrode on the BST layer.

A method for forming a 5 nm thin STO($SrTiO_3$) layer is also disclosed instead of forming a BST layer, whose composition can be hardly controlled, so as to improve the leakage current property when fabricating a capacitor adopting a BST layer in a highly integrated semiconductor device. Unlike a BST layer, the composition of the STO layer can be controlled easily even at the thickness around 5 nm and exhibits reduced leakage current.

That is, after a bottom electrode of a capacitor with a noble metal, such as Pt, Ru or Ir and an STO layer is formed at a thickness ranging from 5 nm to 10 nm by using the atomic layer deposition method which can control the composition easily with excellent step coverage. The STO layer is crystallized through thermal treatment.

And then, the STO deposited on the bottom electrode is treated as a seed layer in the process for forming a BST layer by the atomic layer deposition method or the chemical vapor deposition (CVD) method. The BST/STO dielectric layer is annealed at high temperature for final crystallization. The capacitor inducing the BST/STO dielectric layer not only has dielectric property similar to the capacitor having a BST layer but also has good stability and reduced leakage current.

BRIEF DESCRIPTION OF THE DRAWINGS

The above and other features of the disclosed methods will become apparent from the following description of the preferred embodiments given in conjunction with the accompanying drawings, in wherein.

DETAILED DESCRIPTION OF THE PRESENTLY PREFERRED EMBODIMENTS

Other aspects of the disclosed methods will become apparent from the following description of the embodiments with reference to the accompanying drawings, which is set forth hereinafter.

FIGS. 1A to 1G are cross-sectional views illustrating the method for fabricating a capacitor of a semiconductor device in accordance with a first embodiment.

Figure 1A:
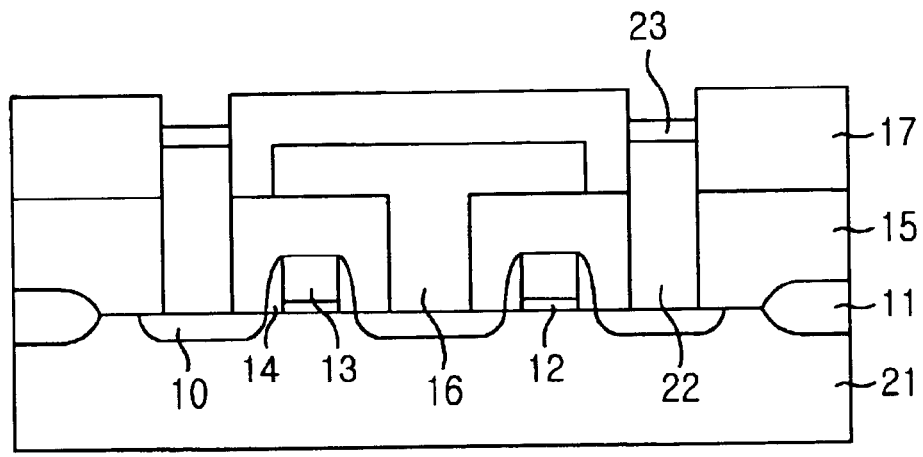
FIGS. 1A to 1G are cross-sectional views illustrating the method for fabricating a capacitor of a semiconductor device in accordance with a first embodiment.

With reference to FIG. 1A, after the formation of an inter-layer dielectric layer (ILD) 15 and 17 on a silicon substrate 21, on which an device isolation layer 11, source/drain region 10, word line 13 and bit line 16 are already formed, a contact mask (not illustrated) is formed on the inter-layer dielectric layer (ILD) 17 with a conventional exposure and development process. After that, a contact hole is formed to expose a predetermined part of the source/drain region 10 by etching the inter-layer dielectric layer (ILD) 17 and 15 using the contact mask, and then the contact mask is removed.

Subsequently, a polysilicon is formed on the entire surface including the contact hole, a polysilicon plug 22 is formed in a predetermined part of the contact hole by etching back the polysilicon to a predetermined depth, and a Ti layer 23 is deposited on the overall surface of the substrate.

The undescribed reference numeral 12 and 14 denote a gate oxide layer and a sidewall spacer oxide layer, respectively.

Figure 1B:
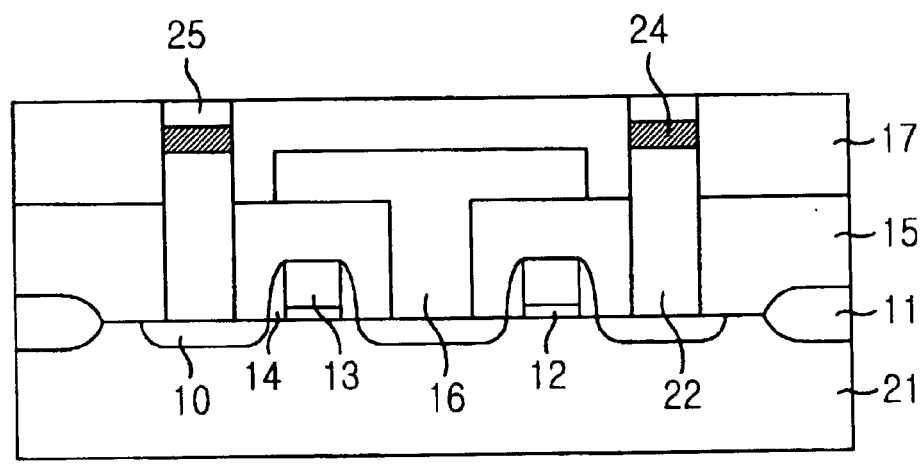

As described in FIG. 1B, a Ti-silicide layer 24 is formed on a polysilicon plug 22 by deriving a chemical reaction between the Si in the polysilicon plug 22 and the Ti through the rapid thermal process (RTP). The Ti layer 23 remaining without reacting with Ti, is wet etched and removed. Here, the Ti-silicide 24 is an ohmic contact layer to improve the contact resistance between the polysilicon plug 22 and the bottom electrode to be formed afterwards. The thermal treatment is performed in the atmosphere of $N_2$ or $NH_3$ at the temperature ranging from about 650 to about 800° C. for a time period ranging from about 30 to about 180 seconds, and thus forms Ti-silicide layer 24 in a C49 or a C54 phase.

Subsequently, forming a TiN layer 25 on the Ti-silicide 24, the TiN layer 25 is polished chemically and mechanically (CMP), or etched back until the surface of the inter-layer dielectric layer 17 is exposed, and is left only in the contact hole.

Here, the TiN layer 25 serves as a diffusion barrier that prevents the oxygen in the bottom electrode to be diffused to the polysilicon plug 22 or the semiconductor substrate 21 during the thermal process for forming dielectric layers of a capacitor. As for the diffusion barrier, a two-component nitrogen compound such as TiN, or a three-component nitrogen compound, e.g., TiAlN, TaSiN, TaAlN or RuTiN can be used. These nitrogen compounds are deposited with the chemical vapor deposition method or physical vapor deposition method.

Figure 1C:
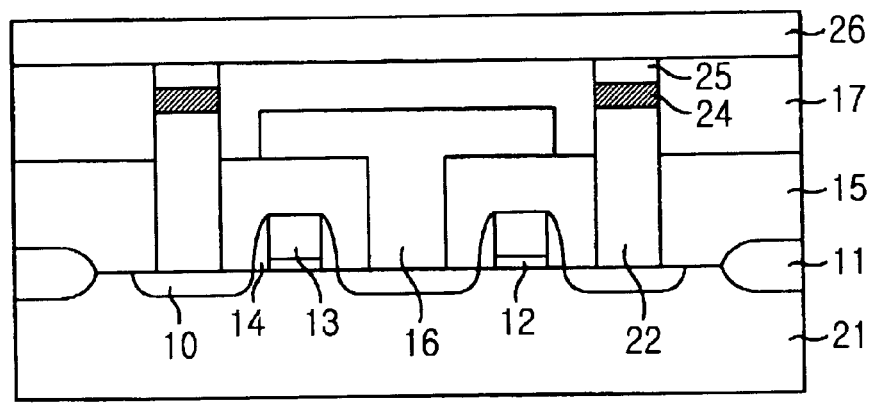

With reference to FIG. 1C, a bottom electrode 26 is deposited by using such a noble metal as Pt, Ru, Ir or SRO($SrRuO_3$), or an oxide conductive material like $RuO_2$ or $IrO_2$.

Figure 1D:
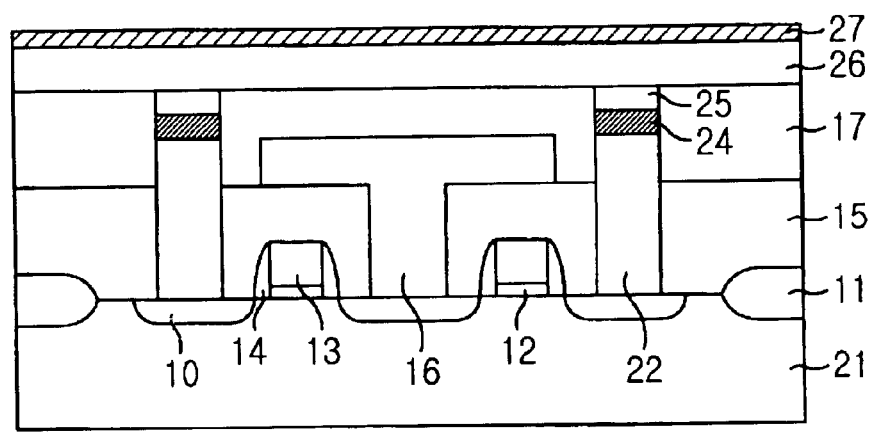

As depicted in FIG. 1D, an STO($SrTiO_3$) layer 27 is deposited in a thickness ranging from about 5 to about 10 nm on the bottom electrode 26 with the atomic deposition method and crystallized through the RTP or the thermal process using a furnace. Unlike the BST layer, it is easy to control the component of the STO layer at a physical thickness of 5 nm, and accordingly the property of superb leakage current may be obtained. At this moment, when an STO layer with the atomic deposition method is formed, the composition ratio of Sr:Ti is controlled to be about 1:1, and the source feeding cycle ratio is controlled from about 1:1 to about 10:1 according to the source flow ratio. This is possible because the atomic layer deposition ratio of SrO used for the source of Sr is relatively slow. The oxidant source used here is $H_2O$ vapor, $O_3$ plasma or $O_3$.

Figure 1E:
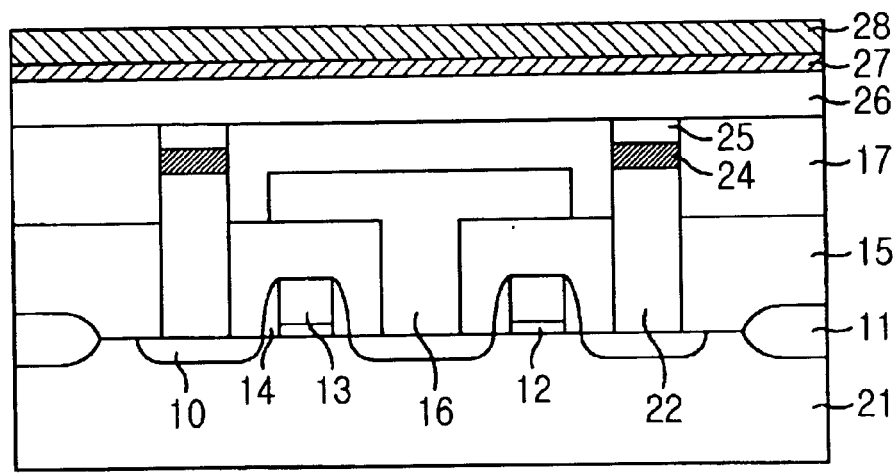

With reference to FIG. 1E, a BST layer 28 is deposited to a thickness ranging from about 10 nm to about 30 nm with the atomic layer deposition method or the chemical vapor deposition method using the STO layer 27 as a seed layer, and then subject to the RTP or a thermal treatment is performed using a furnace.

The rapid thermal process (RTP) or the furnace annealing is performed at a high temperature to obtain dielectric property. Here, the RTP is carried out in the mixed atmosphere of the inactive gas such as $N_2$, Ar or He, and oxygen gas at the temperature ranging from about 500 to about 650° C. for a time period ranging from about 30 to about 60 seconds.

Figure 1F:
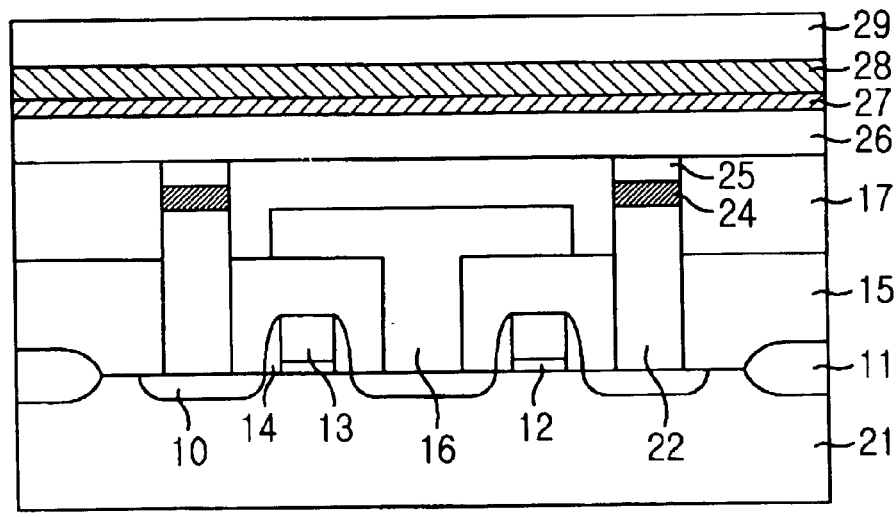

With reference to FIG. 1F, a top electrode is formed on a BST layer 28 with the organic metal chemical vapor deposition method or the atomic layer deposition method. The top electrode is formed with one selected from a group of Ru, Pt, Ir, $IrO_2$, $RuO_2$, W, WN and TiN. Besides, other conductive layer can be used.

Figure 1G:
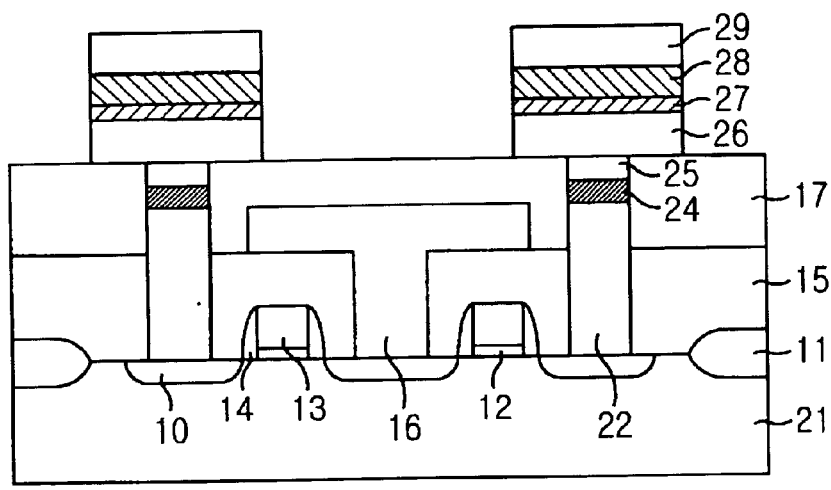

As illustrated in FIG. 1G, the bottom electrode 26, the STO layer 27, the BST layer 28 and the top electrode 29 are patterned.

Figure 2:
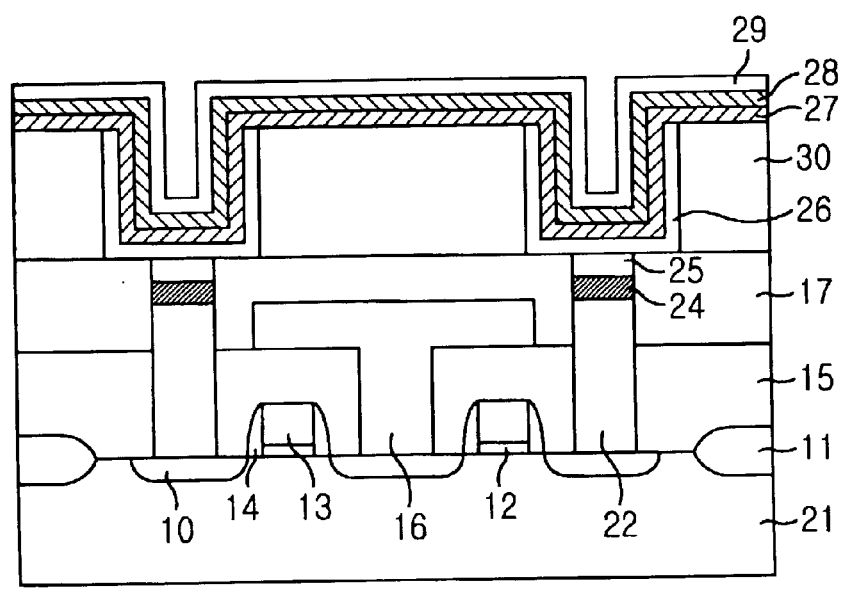
FIG. 2 is a cross-sectional view showing a capacitor of a semiconductor device in accordance with a second embodiment.
Figure 3:
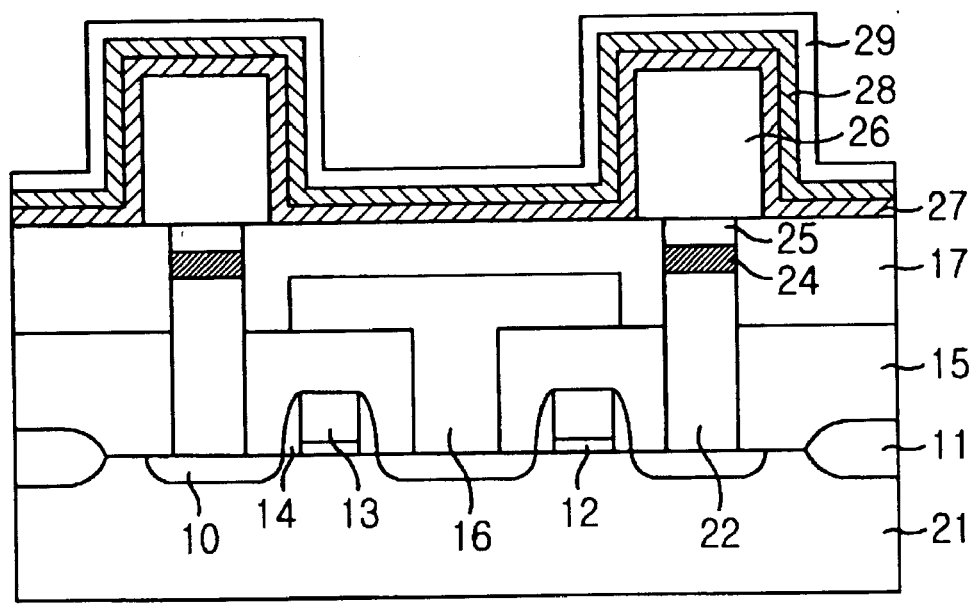
FIG. 3 is a cross-sectional view showing a capacitor of a semiconductor device in accordance with a third embodiment.

FIG. 2 is a cross-sectional view showing a capacitor having a concave structure a semiconductor device in accordance with a second embodiment, and FIG. 3 is a cross-sectional view showing a capacitor having cylindrical structure of a semiconductor device in accordance with a third embodiment.

The method for fabricating a capacitor that can obtain the dielectric property of a BST layer owing to the thinness of an STO layer by forming a dielectric layer with BST/STO double layer. Also, it makes it possible to fabricate a capacitor with confident leakage current property by making the interface between the STO layer and the bottom electrode gets more stable than that of the BST and the bottom electrode.

While the disclosed methods have been described with respect to certain preferred embodiments, it will be apparent to those skilled in the art that various changes and modifications may be made without departing from the scope of the disclosure as defined in the following claims.

What is claimed is:

1. A method for fabricating a capacitor of a semiconductor device comprising:

forming a bottom electrode;

forming an STO seed layer as a first dielectric layer on the bottom electrode by an atomic layer deposition;

forming a BST layer as a second dielectric layer on the STO seed layer; and forming a top electrode on the BST layer.

2. The method as recited in claim 1, wherein the composition ratio of Sr:Ti in the STO seed layer is approximately 1:1.

3. The method as recited in claim 2, wherein $H_2O$ vapor, $O_3$ plasma or $O_3$ is used as the oxidant source gas, in the forming of the seed layer.

4. The method as recited in claim 1, wherein the method further comprises:

performing thermal treatment for crystallizing the STO seed layer.

5. The method as recited in claim 4, wherein thermal treatment is a rapid thermal process(RTP).

6. The method as recited in claim 1, wherein the STO seed layer is formed with a thickness ranging from about 5 nm to about 10 nm.

7. The method as recited in claim 1, wherein the BST layer is formed with a chemical vapor deposition (CVD) method or an atomic layer deposition (ALD) method.

8. The method as recited in claim 1, wherein the BST layer is formed with a thickness ranging from about 10 nm to about 30 nm.

9. The method as recited in claim 1, wherein the method further comprises:

performing thermal treatment for crystallizing the BST layer.

10. The method as recited in claim 9, wherein the thermal treatment is a rapid thermal process(RTP).

11. The method as recited in claim 1, wherein the bottom electrode is formed from a material selected from the group consisting of Pt, Ru, Ir and $SrRuO_3$.

12. The method as recited in claim 1, wherein the top electrode is formed from a material selected from the group consisting of Ru, Pt, Ir, $IrO_2$, $RuO_2$, W, WN and TiN.

13. A capacitor made in accordance with the method of claim 1.

14. A capacitor made in accordance with the method of claim 3.

15. A capacitor made in accordance with the method of claim 5.

16. A capacitor made in accordance with the method of claim 10.

* * * * *